United States Patent [19]

Bains et al.

[11] Patent Number: 5,802,603
[45] Date of Patent: Sep. 1, 1998

[54] METHOD AND APPARATUS FOR ASYMMETRIC/SYMMETRIC DRAM DETECTION

[75] Inventors: Kuljit Bains; Narendra Khandekar, both of Folsom, Calif.

[73] Assignee: Intel Corporation, Santa Clara, Calif.

[21] Appl. No.: 599,056

[22] Filed: Feb. 9, 1996

[51] Int. Cl.[6] ........................................ G06F 12/02
[52] U.S. Cl. .................... 711/202; 711/4; 711/5; 711/15; 365/189.05; 365/230.02; 365/230.06
[58] Field of Search ........................ 395/412, 404, 395/405, 432, 280; 365/189.05, 230.02, 230.06; 711/202, 4, 5, 105

[56] References Cited

U.S. PATENT DOCUMENTS

| | | | |
|---|---|---|---|
| 5,265,218 | 11/1993 | Testa et al. | 395/325 |
| 5,278,801 | 1/1994 | Dresser et al. | 365/230.02 |
| 5,386,383 | 1/1995 | Raghavachari | 365/189.05 |
| 5,600,604 | 2/1997 | Chen | 365/230.06 |

Primary Examiner—Eddie P. Chan
Assistant Examiner—Than V. Nguyen
Attorney, Agent, or Firm—Blakely, Sokoloff, Taylor & Zafman

[57] ABSTRACT

A method and apparatus for detecting DRAM symmetry. A memory address including a row address and a column address bit is forced to a known value regardless of the host bit which would otherwise be mapped thereto. If the forced bit is in the column address it should be a bit which is not used by an asymmetric DRAM of the depth in the system to be tested, but would be used in a symmetric DRAM of the same depth. Conversely, if the forced bit is in the row address the bit should be used in the asymmetric case but not in the symmetric case. It is important that regardless of what bit in the memory address is forced, the forced bit should not be used by both cases at the depth tested. A first and second known value, are written respectively to two memory addresses which differ only in the value which would normally be mapped to this forced bit. The forced bit will cause an overwrite if the DRAM is of the type which uses the forced bit in its addressing. Thus, by reading the potentially overwritten address, symmetry is determined.

20 Claims, 4 Drawing Sheets

| Depth 512 (10 x 9) | | | | | | | | | | | |
|---|---|---|---|---|---|---|---|---|---|---|---|
| MA | 11 | 10 | 9 | 8 | 7 | 6 | 5 | 4 | 3 | 2 | 1 | 0 |
| Row | | | 21 | 20 | 19 | 18 | 17 | 16 | 15 | 14 | 13 | 12 |
| Column | | | | 11 | 10 | 9 | 8 | 7 | 6 | 5 | 4 | 3 |
| Depth 1M (10 x 10) | | | | | | | | | | | |
| MA | 11 | 10 | 9 | 8 | 7 | 6 | 5 | 4 | 3 | 2 | 1 | 0 |
| Row | _11_ | _22_ | 21 | 20 | 19 | 18 | 17 | 16 | 15 | 14 | 13 | 12 |
| Column | | | 11 | 22 | 10 | 9 | 8 | 7 | 6 | 5 | 4 | 3 |
| Depth 1M Asymmetric (12 x 8) | | | | | | | | | | | |
| MA | 11 | 10 | 9 | 8 | 7 | 6 | 5 | 4 | 3 | 2 | 1 | 0 |
| Row | 11 | 22 | 21 | 20 | 19 | 18 | 17 | 16 | 15 | 14 | 13 | 12 |
| Column | | | _11_ | _22_ | 10 | 9 | 8 | 7 | 6 | 5 | 4 | 3 |
| Depth 2M (11 x 10) | | | | | | | | | | | |
| MA | 11 | 10 | 9 | 8 | 7 | 6 | 5 | 4 | 3 | 2 | 1 | 0 |
| Row | | 22 | 21 | 20 | 19 | 18 | 17 | 16 | 15 | 14 | 13 | 12 |
| Column | | | 11 | 23 | 10 | 9 | 8 | 7 | 6 | 5 | 4 | 3 |
| Depth 4M (11 x 11) | | | | | | | | | | | |
| MA | 11 | 10 | 9 | 8 | 7 | 6 | 5 | 4 | 3 | 2 | 1 | 0 |
| Row | _11_ | 22 | 21 | 20 | 19 | 18 | 17 | 16 | 15 | 14 | 13 | 12 |
| Column | | 11 | 24 | 23 | 10 | 9 | 8 | 7 | 6 | 5 | 4 | 3 |
| Depth 4M Asymmetric (12 x 10) | | | | | | | | | | | |
| MA | 11 | 10 | 9 | 8 | 7 | 6 | 5 | 4 | 3 | 2 | 1 | 0 |
| Row | 11 | 22 | 21 | 20 | 19 | 18 | 17 | 16 | 15 | 14 | 13 | 12 |
| Column | | _11_ | 24 | 23 | 10 | 9 | 8 | 7 | 6 | 5 | 4 | 3 |
| SDRAM X16 (12 x 8) | | | | | | | | | | | |
| MA | 11 | 10 | 9 | 8 | 7 | 6 | 5 | 4 | 3 | 2 | 1 | 0 |
| Row | 11 | 22 | 21 | 20 | 19 | 18 | 17 | 16 | 15 | 14 | 13 | 12 |
| Column | 11 | 0,1 | | | 10 | 9 | 8 | 7 | 6 | 5 | 4 | 3 |
| SDRAM X8 (12 x 9) | | | | | | | | | | | |
| MA | 11 | 10 | 9 | 8 | 7 | 6 | 5 | 4 | 3 | 2 | 1 | 0 |
| Row | 11 | 22 | 21 | 20 | 19 | 18 | 17 | 16 | 15 | 14 | 13 | 12 |
| Column | 11 | 0,1 | | 23 | 10 | 9 | 8 | 7 | 6 | 5 | 4 | 3 |
| SDRAM X4 (12 x 10) | | | | | | | | | | | |
| MA | 11 | 10 | 9 | 8 | 7 | 6 | 5 | 4 | 3 | 2 | 1 | 0 |
| Row | 11 | 22 | 21 | 20 | 19 | 18 | 17 | 16 | 15 | 14 | 13 | 12 |
| Column | 11 | 0,1 | 24 | 23 | 10 | 9 | 8 | 7 | 6 | 5 | 4 | 3 |

Fig. 2
(Prior Art)

| Depth 1M (10 x 10) | | | | | | | | | | | | |
|---|---|---|---|---|---|---|---|---|---|---|---|---|
| MA | 11 | 10 | 9 | 8 | 7 | 6 | 5 | 4 | 3 | 2 | 1 | 0 |
| Row | *11* | 22 | 21 | 20 | 19 | 18 | 17 | 16 | 15 | 14 | 13 | 12 |
| Column | | 0 | 0 | 22 | 10 | 9 | 8 | 7 | 6 | 5 | 4 | 3 |
| Depth 1M Asymmetric (12 x 8) | | | | | | | | | | | | |
| MA | 11 | 10 | 9 | 8 | 7 | 6 | 5 | 4 | 3 | 2 | 1 | 0 |
| Row | 11 | 22 | 21 | 20 | 19 | 18 | 17 | 16 | 15 | 14 | 13 | 12 |
| Column | | 0 | 0 | 22 | 10 | 9 | 8 | 7 | 6 | 5 | 4 | 3 |
| Depth 4M (11 x 11) | | | | | | | | | | | | |
| MA | 11 | 10 | 9 | 8 | 7 | 6 | 5 | 4 | 3 | 2 | 1 | 0 |
| Row | *11* | 22 | 21 | 20 | 19 | 18 | 17 | 16 | 15 | 14 | 13 | 12 |
| Column | | 0 | 0 | 23 | 10 | 9 | 8 | 7 | 6 | 5 | 4 | 3 |
| Depth 4M Asymmetric (12 x 10) | | | | | | | | | | | | |
| MA | 11 | 10 | 9 | 8 | 7 | 6 | 5 | 4 | 3 | 2 | 1 | 0 |
| Row | 11 | 22 | 21 | 20 | 19 | 18 | 17 | 16 | 15 | 14 | 13 | 12 |
| Column | | 0 | 0 | 23 | 10 | 9 | 8 | 7 | 6 | 5 | 4 | 3 |

Fig. 3

| Final Mapping for all DRAMs | | | | | | | | | | | | |
|---|---|---|---|---|---|---|---|---|---|---|---|---|
| MA | 11 | 10 | 9 | 8 | 7 | 6 | 5 | 4 | 3 | 2 | 1 | 0 |
| Row | 11 | 22 | 21 | 20 | 19 | 18 | 17 | 16 | 15 | 14 | 13 | 12 |
| Column | 11 | 11, 1, 0 | 24, 11, 0 | 23, 22, 11 | 10 | 9 | 8 | 7 | 6 | 5 | 4 | 3 |

Fig. 4

METHOD AND APPARATUS FOR ASYMMETRIC/SYMMETRIC DRAM DETECTION

BACKGROUND OF THE INVENTION

(1) Field of the Invention

The invention relates to dynamic random access memory (DRAM). More specifically, the invention relates to detecting whether a particular DRAM is symmetric or asymmetric.

(2) Related Art

Dynamic random access memory (DRAM) is a common memory type used in computer systems. DRAM is accessed by driving a row address on memory address (MA) lines followed by the driving of a column address on those same lines. In a typical existing system, a host central processing unit (CPU) performs a memory transaction by placing a 32-bit host address on a bus. A memory controller claims the host address and translates it into a memory address including a row address and a column address. This usually involves the form of taking the least significant bits (e.g., 3–21 or 3–24) of the host address, depending on the size of the DRAM, and mapping those bits into a row address and a column address. The row and column addresses are then strobed consecutively onto the MA lines of the DRAM. This process is generally well-known in the art.

DRAMs are commercially available in several depths. Several sizes of a DRAM variant, synchronous DRAM (SDRAM), is also in common usage, but currently existing SDRAMs are all asymmetric. Some typical DRAM depths include 512K, 1M, 2M, and 4M. At some depths (for example, 1M and 4M), DRAMs can be either symmetric or asymmetric. An asymmetric 1M DRAM is 12×8. In other words, the mapped row address is twelve bits long, while the column address is only eight bits long. Thus asymmetric means that the row and column addresses are not of equal length when accessing the DRAM. The 1M symmetric DRAM is 10×10, i.e., the mapped row and mapped column addresses are equal length at ten bits each. An analogous case exists for DRAMs having a depth of 4M, asymmetric 4M DRAMs are 12×10, while symmetric 4M DRAMs are 11×11.

Memory is typically accessed one page at a time, and paging is generally well-known in the art. Basically, once a row address has been asserted on the MA lines, every column of that row can be accessed without reasserting the row address. All of the columns in a particular row constitute a memory page. As the number of bits used to designate the column diminishes, the maximum possible page size decreases as well. Thus, an asymmetric DRAM which has a shorter column address has a smaller maximum page size than the symmetric DRAM which has a longer column address. In the 1M asymmetric case, the maximum allowable page size is 2K, then the symmetric 1M DRAM allows a 4K page size. A larger page size results in fewer page misses. Since a page hit transaction in a system usually takes substantially fewer clock cycles then a page miss requires, a reduction in page misses from the use of a larger page size may result in substantial efficiency improvement However, because existing systems cannot detect symmetry of the DRAMs used and versatility to accept the plurality of different DRAMs commercially available is desirable, system designers have typically limited page sizes to the largest size which can be handled by all supported DRAMs (e.g., 2K where 512K and 1M asymmetric are allowed). This paging limitation when applied to the symmetric case creates the increased page handling overhead above that which would be required for 4K paging.

Therefore, it would be desirable if one were able to detect whether a particular DRAM is symmetric or asymmetric, thereby permitting use of a larger page size in the symmetric case with a corresponding reduction in page handling overhead.

BRIEF SUMMARY OF THE INVENTION

A method and apparatus for detecting DRAM symmetry is disclosed. A memory address including a row address and a column address bit is forced to a known value regardless of the host bit which would otherwise be mapped thereto. If the forced bit is in the column address it should be a bit which is not used by an asymmetric DRAM of the depth in the system to be tested, but would be used in a symmetric DRAM of the same depth. Conversely, if the forced bit is in the row address the bit should be used in the asymmetric case but not in the symmetric case. It is important that regardless of what bit in the memory address is forced, the forced bit should not be used by both cases at the depth tested. A first and second known value, are written respectively to two memory addresses which differ only in the value which would normally be mapped to this forced bit. The forced bit will cause an overwrite if the DRAM is of the type which uses the forced bit in its addressing. Thus, by reading the potentially overwritten address, symmetry is determined.

BRIEF DESCRIPTION OF THE DRAWINGS

FIG. 2 is a table showing prior art host to row and column address mapping for several depths of DRAM.

FIG. 3 is a table showing host to row and column address mapping in one example of symmetry detect mode.

FIG. 4 is a table showing one possible overall host to row and column address mapping of an exemplary system employing the invention with arbitrary depth DRAM.

DETAILED DESCRIPTION OF THE INVENTION

Figure 1:
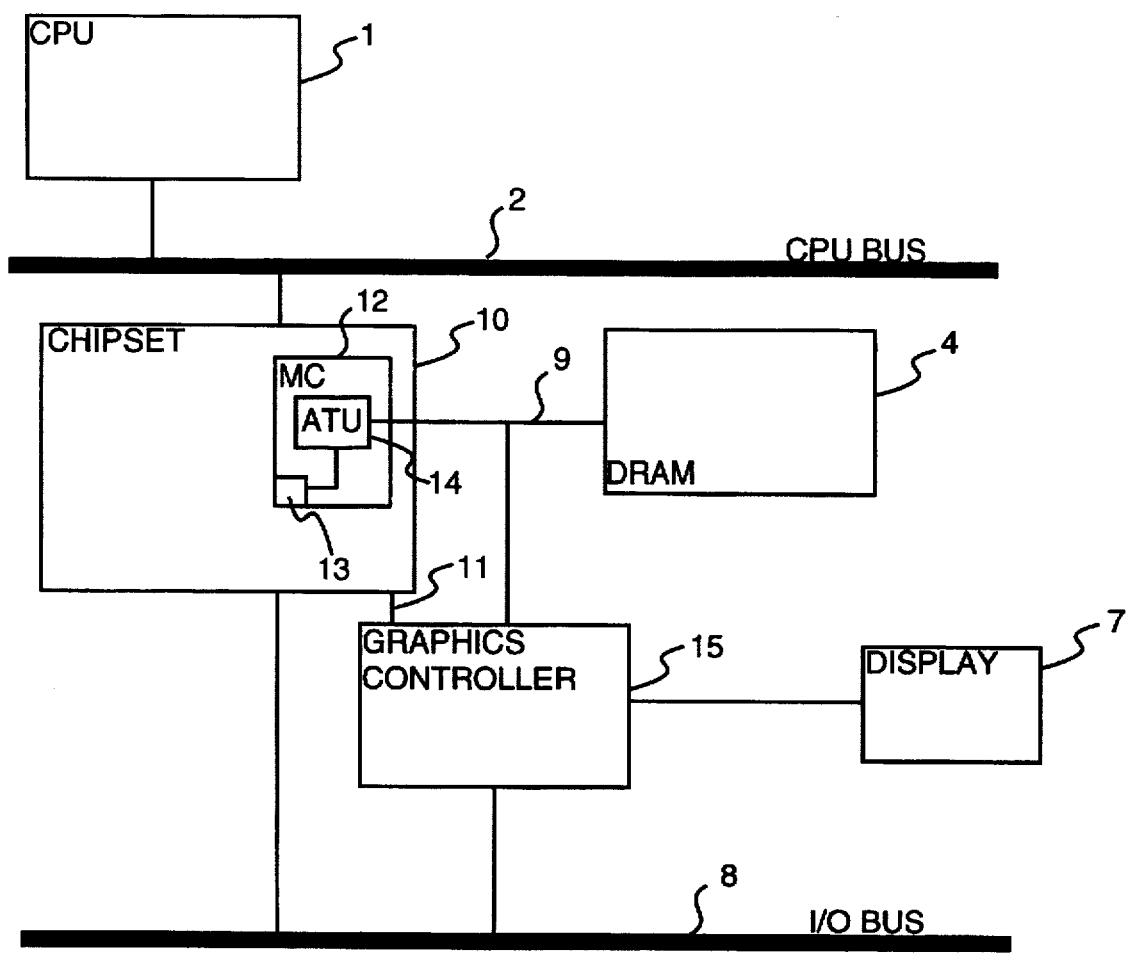
FIG. 1 is a block diagram of an exemplary system employing the invention.

FIG. 1 shows a computer system employing one embodiment of the invention. Central processing unit (CPU) 1 resides on CPU bus 2. The chipset 10 which includes a memory controller 12 also resides on CPU bus 2. Memory transactions from CPU 1 are placed on CPU bus 2 and claimed by memory controller 12 of chipset 10. The memory controller 12 translates the host address into row and column addresses in its address translation unit (ATU) 14. The row address and column address can then be strobed consecutively on the MA lines in the usual way. A symmetry detect mode bit 13 is a programmable bit provided within the memory controller 12, which when set, places the system in a symmetry detect mode. In symmetry detect mode, the mapping of host address to row address and column address is altered as is discussed more fully below in connection with FIG. 3.

Memory bus 9 including the MA lines and couples the memory controller to the DRAM 4. As shown, a graphics controller 15 is also coupled to the memory bus 9. Because the graphics controller 15 and the memory controller 12 share memory bus 9, arbitration lines 11 are used to arbitrate access to the memory bus 9. Graphics controller 15 is also coupled to display 7 which may be any standard display unit.

Both the chipset 10 and the graphics controller 15 are coupled to input/output (I/O) bus 8 which may be peripheral component interconnect (PCI) bus or any other standard I/O bus.

When the system is powered up, a basic input/output system (BIOS) performs a number of initialization procedures which are known in the art. Among these is the determination of the size and type of memory available to the system. In one embodiment of the invention, the BIOS will set the symmetry detect mode bit 13 when the size of DRAM 4 in the system corresponds to a DRAM depth which can be symmetric or asymmetric. Currently, symmetric DRAMs are available in 1M and 4M depths. This corresponds to memory sizes of 8 MB and 32 MB, respectively in a 64-bit architecture. BIOS will also recognize whether an SDRAM is present in the system as this would obviate the need to detect for symmetry since existing SDRAM are all asymmetric. However, it is envisioned that should symmetric SDRAM become available, the instant scheme could be applied to detect such symmetry.

In another exemplary embodiment, a device sharing the DRAM 4 (e.g., the graphics controller 15) may be permitted to set the symmetry detect mode bit 13 and prompt the necessary writes and reads (described below) to dynamically determine if the DRAM 4 is symmetric or asymmetric. However, when the below described symmetry detect routine is employed dynamically, care must be taken to store and return the content of the addresses written during the routine to avoid corruption of these addresses and/or loss of data FIG. 2 shows prior art mapping of host addresses to row and column addresses for several depths of DRAMs. In each case the numbers in the row rows and column rows indicate bits of a host address mapped to the corresponding bits of the row address and column address (except the eleventh bit in SDRAM cases). The first eight bits (MA 0-7) are the same in every case. Bits 9-12 of the column address vary depending on the size of DRAM and whether or not SDRAM is employed. It is also notable that for particular depth where both symmetric and asymmetric case exists, dual mapping is used to insure compatibility regardless of symmetry. In such cases, the underlined italicized entries are not used in addressing the particular DRAM involved. The eleventh bit of the SDRAM column address is asserted as either 0 or 1 and does not correspond to the bits of host address. A 0 in this bit is to allow the pre-charge of a bank selected by bit 11. A 1 in this bit is for a "pre-charge all" command required during SDRAM initialization. A multiplexer is typically used to select either 0, 1, or 11 for insertion into the eleventh column address bit depending on the size of DRAM and what SDRAM function is to be performed. Significantly, this multiplexer is not in the critical path because the multiplexer can be switched during a row miss while the latched address can continually be used during page hits.

FIG. 3 shows an alteration in the mapping of host address to row and column address when the system is in symmetry detect mode. Basically stated, the tenth and eleventh bit (MA9 and MA10) of the column address are forced to 0. It is not necessary to force both bits to 0 for a particular case. However, using the routine described below, forcing both to 0 works for either a 1M case or a 4M case. With this mapping scheme, two writes and a read will determine the symmetry of the DRAM. Specifically, if a known value, (e.g., 0Ah) is written to memory address 00000000h and a second known value (e.g., 0Bh) is written to memory address 00000800h, a read of location 00000000h will return 0Bh if the DRAM is symmetrical and 0Ah if the DRAM is asymmetrical. The reason for this will become clear when the maps of FIG. 3 are compared with corresponding maps of FIG. 2.

Talking the 1M case for example, where the DRAM is asymmetric, the tenth and eleventh bits are unused in the column address. Thus, forcing them to 0 has no effect. Conversely, in the symmetric case, bit 9 would normally have host address bit 11 mapped into it. Because memory address 00000000h differs from memory address 00000800h only by the value in host address bit 11 forcing the tenth bit of the column address to 0 in the symmetric case causes the write to memory address 00000800h to overwrite the previous write to memory address 00000000h. An analogous case exists for the 4M situation. At first, it appears that since host address bit 24 is normally mapped into the tenth bit of the column address, some data may be lost. However, since both write addresses were selected to have a 0 in the 24-bit in any case, forcing the tenth bit to 0 has no effect on the result.

Rather than forcing a bit of the column address one could force a most significant bit (or another bit not part of the row address in the symmetric case) of the row address for an asymmetric DRAM of a given depth. For example in the 1M case either the eleventh or twelfth bit of the row address could be forced, but selection of the forced bit effects choice of the write addresses as discussed above. In such case an asymmetric row address would lose data while the symmetric DRAM of the same depth would not. The same series of reads and writes will yield an overwrite in the asymmetric case. Thus it is with the scope and contemplation of the instant invention to perform operations on a row address analogous to those applicable to the column address as discussed above.

It should be recognized that this asymmetric/symmetric detection does not rely on the use of a particular mapping scheme shown in the figures. Specifically, because a certain number of bits are required to address any particular depth of DRAM, shorting a row address implies lengthening a column address and vice versa. Therefore, regardless of the mapping scheme, there will be at east one bit which "moves" from the row address to the column address as between an asymmetric and symmetric DRAM of the same depth. If the bit of the column address which receives the "moving" bit (or the bit of the row address donating the "moving bit") is forced to a known value (either 0 or 1) and first and second memory addresses to be written are selected which differ only in the "moving" bit, an overwrite situation can be created. Stated differently, the address should be selected such that the first address is equal to the second address when the forced known value is used in the addressing. In the above example if the tenth bit were forced to 1 (instead of 0) in the 1M case switching the order of the writes creates the same overwrite condition. Based on the existence of an overwrite detection of symmetric and asymmetric DRAMs becomes possible as described. Moreover, because maximum page size is a function of the number of bits in the column address, memory depth and symmetry give maximum allowable page size.

In one embodiment, an indicator of maximum page size is stored in the control register or other storage unit which can be accessed by devices sharing the DRAM. Such devices are then able to determine page size up to the maximum page size the device wants to employ in its memory management routines. This is a particular benefit in certain graphics applications when the graphics controller shares the memory with the host processor as shown in FIG. 1. Some graphics applications have been demonstrated to have a 20% efficiency improvement when a 4K page size is employed over when a 2K page size is employed. Thus, in such cases, detection of the existence of a symmetric DRAM represents a large efficiency gain if the graphic controller can opt to use the larger page size. The memory controller may also be able to achieve some efficiency improvements by changing the page size used when a larger page size is allowed.

FIG. 4 shows a final mapping of one embodiment of the invention which applies for all the DRAMs shown in FIG. 2. It will be noted that the column address bits 9–11 (MA lines 8–10) have three possible values. By employing 3:1 multiplexers, the desired mapping can be accomplished. As discussed above in connection with the prior at SDRAM mapping of the eleventh bit, this is not in the critical and multiplexer transition can be done on row switches The multiplexer for bit 9 (MA8) is driven purely by memory size. A memory size of 4MB results in a host address bit 11 mapped into this location, while 8 MB results in host address bit 22 and 16 MB or 32 MB results in host address bit 23 being mapped here. The selection of multiplexer on bit 10 (MA9) is driven by both sized and the symmetry detect mode bit. A set symmetry detect mode bit drives bit 10 to 0. But if the symmetry detect mode bit is not set, 8 MB or 16 MB maps host bit 11 into this location while a 32 MB memory size causes host bit 24 to be mapped to bit 10. The multiplexer for bit 11 (MA10), like bit 10, will be forced to 0 when the symmetry detect mode bit is set or in response to an SDRAM pre-charge, it will be driven to 1 in response to a "pre-charge all" in an SDRAM case. Host bit 11 is mapped to line 10 for 32 MB memory sizes.

In the foregoing specification, the invention has been described with reference to specific embodiment thereof. It will however be evident that various modifications and changes can be made thereto without departing from the broader spirit and scope of the invention as set forth in the appended claims. The specification and drawings are, accordingly, to be regarded in an illustrative rather than a restrictive sense. Therefore, the scope of the invention should be limited only by the appended claims.

What is claimed is:

1. A method of determining if a DRAM is symmetric or asymmetric comprising:

forcing a predetermined bit of a memory address to a predetermined value, the memory address comprising a row address and a column address;

writing a first known value to a first host address;

writing a second known value to a second host address; and reading a value from the first host address to determine which of symmetric and asymmetric the DRAM is.

2. The method of claim 1 further comprising the step of: setting a programmable bit if symmetry detection is desired.

3. The method of claim 1 wherein a predetermined bit is in the column address.

4. The method of claim 1 wherein the predetermined bit is in the row address.

5. The method of claim 1 wherein the predetermined value is zero.

6. The method of claim 1 wherein a first host address and second host address which differ in only a single bit, the single bit used as part of the row address if the DRAM is asymmetric, and used as part of the column address if the DRAM is symmetric.

7. A system for determining if a DRAM is symmetric or asymmetric, the system comprising:

a CPU coupled to a CPU bus;

a memory controller to receive a first host address and a second host address from the CPU bus, maps each of the host addresses into a memory address comprising a row address and a column address to the DRAM, the memory controller being coupled to the DRAM by a memory bus; and in response to a programmable bit being set, the memory controller forcing a predetermined value into a predetermined bit of the memory address; wherein a write of a known value into the first host address and a write of a second known value into the second host address, followed by a read of the first host address indicates whether the DRAM is symmetric or asymmetric.

8. The system of claim 7 further comprising a control register which stores a maximum page size usable in the system, the maximum page size determined from the symmetry of the DRAM.

9. The system of claim 7 wherein the predetermined bit is a bit of the column address.

10. The system of claim 7 wherein the predetermined bit is a bit of the row address.

11. The system of claim 7 wherein the predetermined value is zero.

12. The system of claim 7 wherein the programmable bit is set if a size of memory is one of 8 MB or 32 MB and cleared after a symmetry determination.

13. The system of claim 12 wherein the programmable bit is set by BIOS.

14. An apparatus comprising:

means for writing to and reading from a DRAM;

means for translating a first host address and a second host address each into a memory address consisting of row address and a column address;

means for forcing at least one bit of the memory address to a predetermined value; wherein when a first host address is written and a second host address is written, a subsequent read of the first host address indicates whether the DRAM is symmetric or asymmetric.

15. A memory controller having a symmetry detect mode to determine if a DRAM is symmetric or asymmetric, the memory controller comprising:

an address translation unit which translates a host address into a memory address comprising a row address and a column address; and a programmable bit which when set places the memory controller in the symmetry detect mode wherein a predetermined bit of the memory address is forced to a determined value while the memory controller is in the symmetry detect mode.

16. The memory controller of claim 15 wherein a tenth bit of the column address is the predetermined bit.

17. The memory controller of claim 15 wherein an eleventh bit of the row address is the predetermined bit.

18. The memory controller of claim 15 wherein the determined value is zero.

19. The memory controller of claim 15 wherein the programmable bit is set by a BIOS at power up.

20. The memory controller of claim 15 further comprising a control register indicating the maximum page size allowed by the DRAM.

* * * * *